(12) United States Patent
Kawanabe et al.

(10) Patent No.: US 12,183,601 B2
(45) Date of Patent: Dec. 31, 2024

(54) STRUCTURAL BODY AND HEATING APPARATUS

(71) Applicant: KYOCERA Corporation, Kyoto (JP)

(72) Inventors: Yasunori Kawanabe, Kirishima (JP); Takeshi Muneishi, Kusatsu (JP); Yoshihiro Okawa, Kirishima (JP)

(73) Assignee: KYOCERA CORPORATION

( * ) Notice: Subject to any disclaimer, the term of this patent is extended or adjusted under 35 U.S.C. 154(b) by 287 days.

(21) Appl. No.: 17/768,814

(22) PCT Filed: Sep. 25, 2020

(86) PCT No.: PCT/JP2020/036477
§ 371 (c)(1),
(2) Date: Apr. 13, 2022

(87) PCT Pub. No.: WO2021/075241
PCT Pub. Date: Apr. 22, 2021

(65) Prior Publication Data
US 2023/0142358 A1 May 11, 2023

(30) Foreign Application Priority Data
Oct. 18, 2019 (JP) .................. 2019-190795

(51) Int. Cl.
*H01L 21/683* (2006.01)
*H01L 21/67* (2006.01)
(Continued)

(52) U.S. Cl.
CPC ...... *H01L 21/67103* (2013.01); *H01L 21/683* (2013.01); *H05B 3/03* (2013.01); *H05B 3/265* (2013.01)

(58) Field of Classification Search
CPC ... H01L 21/67103; H01L 21/683; H05B 3/03; H05B 3/265
(Continued)

(56) References Cited

U.S. PATENT DOCUMENTS 6,303,879 B1* 10/2001 Burkhart ........... H01L 23/49827
174/262
6,825,448 B2* 11/2004 Gianoulakis ...... H01L 21/67103
338/322
(Continued)

FOREIGN PATENT DOCUMENTS

| JP | 2001-230306 A | 8/2001 |
| JP | 2003-40686 A | 2/2003 |
| JP | 2016-139503 A | 8/2016 |

*Primary Examiner* — Charlee J. C. Bennett
(74) *Attorney, Agent, or Firm* — Procopio, Cory, Hargreaves & Savitch LLP

(57) ABSTRACT

A structural body (2, 2A to 2E) according to the present disclosure includes a base (10, 10D, 10E), a first electrode layer (111), a second electrode layer (112), a first via conductor (131), a second via conductor (132), and a connection conductor (133). The base (10, 10D, 10E) is composed of a ceramic. The first electrode layer (111) and the second electrode layer (112) are located inside the base (10, 10D, 10E). The first via conductor (131) and the second via conductor (132) are located inside the base (10, 10D, 10E) and connect the first electrode layer (111) and the second electrode layer (112). The connection conductor is located inside the base (10, 10D, 10E), and connects the first via conductor and the second via conductor.

9 Claims, 18 Drawing Sheets

(51) Int. Cl.
 *H05B 3/03* (2006.01)
 *H05B 3/26* (2006.01)
(58) Field of Classification Search
 USPC .......................................................... 118/725
 See application file for complete search history.

(56) References Cited

U.S. PATENT DOCUMENTS

| | | | | |
|---|---|---|---|---|
| 7,011,874 | B2* | 3/2006 | Ito ....................... | H01L 21/6835 |
| | | | | 219/649 |
| 11,631,597 | B2* | 4/2023 | Miwa ..................... | H05B 3/74 |
| | | | | 219/444.1 |
| 2003/0104186 | A1 | 6/2003 | Ito | |
| 2005/0018379 | A1 | 1/2005 | Ito | |
| 2009/0173448 | A1* | 7/2009 | Fujii ................... | H01L 21/6833 |
| | | | | 156/379.6 |
| 2017/0359859 | A1* | 12/2017 | Tosa .................... | H01L 21/6831 |
| 2019/0371694 | A1* | 12/2019 | Hsu ..................... | H01L 25/0655 |
| 2022/0201804 | A1* | 6/2022 | Kawanabe ............... | H05B 3/28 |
| 2023/0141651 | A1* | 5/2023 | Kawanabe ........... | H01L 21/683 |
| | | | | 118/725 |

* cited by examiner

STRUCTURAL BODY AND HEATING APPARATUS

TECHNICAL FIELD

The present disclosure relates to a structural body and a heating apparatus.

BACKGROUND ART

A substrate composed of a ceramic has excellent thermal resistance compared to metal and resin, or the like. For example, an aluminum nitride ceramic has high thermal conductivity and may be used as a structural body for placing or holding an object to be treated, such as various elements, components, or the like, when performing heat treatment of the object to be treated.

CITATION LIST

Patent Literature

Patent Document 1: JP 2003-40686 A

SUMMARY OF INVENTION

A structural body according to one aspect of the present disclosure includes a base, a first electrode layer, a second electrode layer, a first via conductor, a second via conductor, and a connection conductor. The base is composed of a ceramic. The first electrode layer and the second electrode layer are located inside the base. The first via conductor and the second via conductor are located inside the base and connect the first electrode layer and the second electrode layer. The connection conductor is located inside the base and connects the first via conductor and the second via conductor.

DESCRIPTION OF EMBODIMENTS

The following is a detailed description of a structural body and a heating apparatus according to the present disclosure (hereinafter referred to as "embodiments") with reference to the drawings. It should be noted that the structural body and the heating apparatus according to the present disclosure are not limited by the embodiments. In addition, embodiments can be appropriately combined so as not to contradict each other in terms of processing content. In the following embodiments, the same portions are denoted by the same reference signs, and overlapping explanations are omitted.

In the embodiments described below, expressions such as "constant", "orthogonal", "vertical", and "parallel" may be used, but these expressions do not need to be exactly "constant", "orthogonal", "vertical", and "parallel". In other words, it is assumed that the above expressions allow deviations in manufacturing accuracy, installation accuracy, or the like.

In each of the drawings referred to below, the vertical upward direction is defined as the Z axis direction in order to make the description easier to understand.

Overall Configuration of Wafer Placement Apparatus

Figure 1:
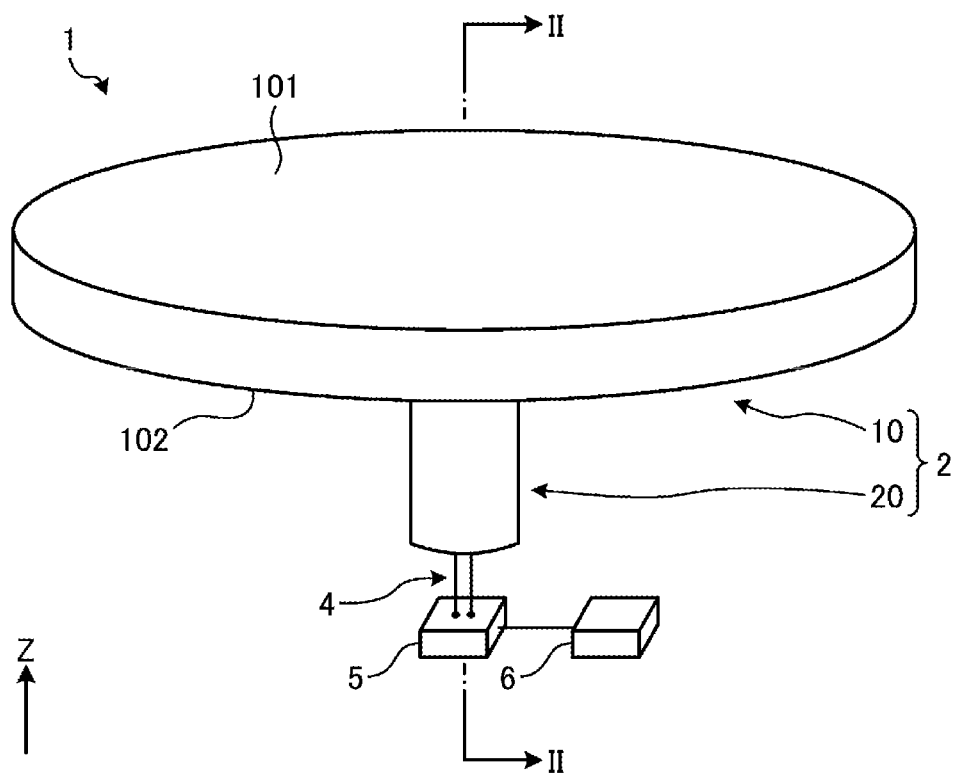
FIG. 1 is a schematic perspective view of a wafer placement apparatus according to an embodiment.

First, a configuration of a wafer placement apparatus according to an embodiment will be described with reference to FIG. 1. FIG. 1 is a schematic perspective view of a wafer placement apparatus 1 according to an embodiment.

The wafer placement apparatus 1 according to an embodiment illustrated in FIG. 1 is an apparatus for placing a semiconductor wafer, a crystal wafer, or other wafer (hereinafter simply referred to as "wafer"). The wafer placement apparatus 1 has a heating function for heating the placed wafer, and is mounted, for example, in a substrate processing apparatus for performing plasma treatment or the like on the wafer.

As illustrated in FIG. 1, the wafer placement apparatus 1 includes a structural body 2, a wiring portion 4, a power supply unit 5, and a controller 6.

The structural body 2 includes a base 10 having a disc shape with a thickness in the vertical direction (Z axis direction) and a shaft 20 having a tubular shape connected to the base 10. A wafer is placed on an upper surface 101 of the base 10. Further, the shaft 20 is connected to a lower surface 102 of the base 10. The upper surface 101 and the lower surface 102 of the base 10 have substantially the same shape and are both larger in diameter than the wafer. An electrode layer (not illustrated here) as a heating element is located inside the base 10.

The wiring portion 4 electrically connects the electrode layer located inside the base 10 to the power supply unit 5 located outside the base 10. The power supply unit 5 is electrically connected to the electrode layer through the wiring portion 4 and supplies power to the electrode layer through the wiring portion 4. The power supply unit 5 includes a power supply circuit for converting power supplied from a power supply (not illustrated) into an appropriate voltage. The controller 6 controls the power supply in the power supply unit 5.

The wafer placement apparatus 1 is configured as described above, and heats a wafer placed on the wafer placement surface 101 by heating the electrode layer inside the base 10 using power supplied from the power supply unit 5.

Configuration of Structural Body

Figure 2:
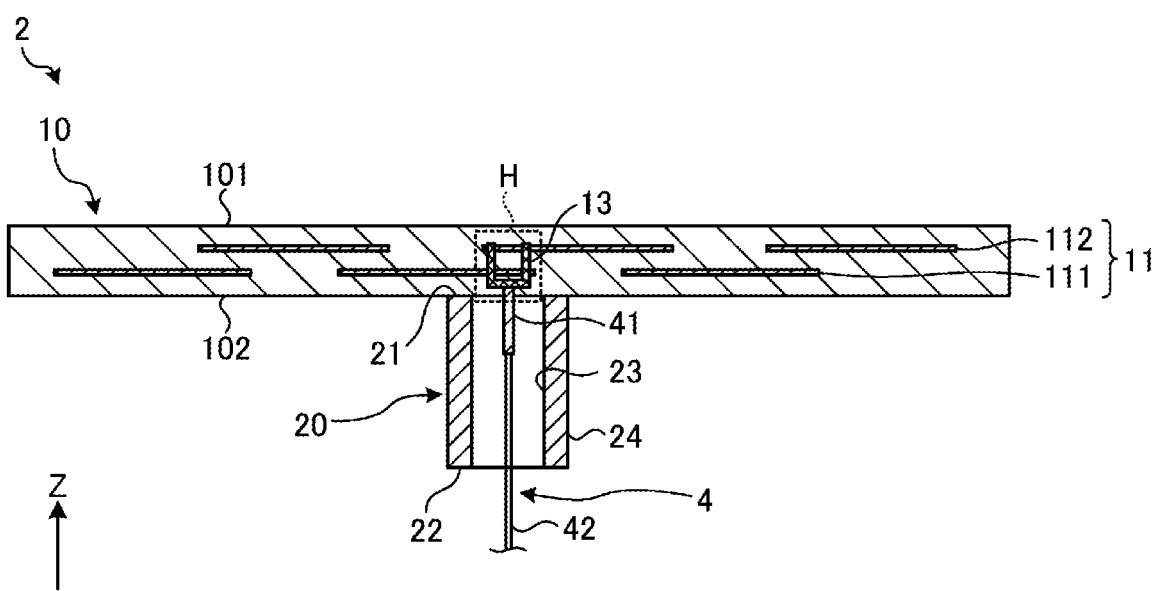
FIG. 2 is a schematic cross-sectional view of a structural body according to the embodiment.

Next, the configuration of the structural body 2 will be described with reference to FIG. 2. FIG. 2 is a schematic cross-sectional view of the structural body 2 according to the embodiment. FIG. 2 illustrates a schematic cross-sectional view taken along the line II-II in FIG. 1.

Base

The base 10 is composed of a ceramic. The ceramic constituting the base 10 includes as a main component, for example, aluminum nitride (AlN), aluminum oxide ($Al_2O_3$, alumina), silicon carbide (SiC), silicon nitride ($Si_3N_4$), or the like. The main component of a material means here, for example, a component that accounts for 50 mass % or more or 80 mass % or more of the material. The base 10 may include, for example, a sintering aid in addition to the above ceramic. As the sintering aid, for example, a mixture of calcium oxide (CaO) and yttrium oxide ($Y_2O_3$) is used.

As illustrated in FIG. 2, the electrode layer 11 is located inside the base 10. In the present embodiment, the electrode layer 11 includes a first electrode layer 111 and a second electrode layer 112. The first electrode layer 111 is an electrode layer located relative to the lower surface 102 side of the base 10. The second electrode layer 112 is an electrode layer located relative to the first electrode layer 111 on the upper surface 101 (which may be described as "wafer placement surface 101" hereinafter) side of the base 10. The first electrode layer 111 and the second electrode layer 112 are, for example, composed of a metal such as Ni, W, Mo and Pt, or an alloy including at least one of the aforementioned metals.

The first electrode layer 111 and the second electrode layer 112 extend along the wafer placement surface 101. Specifically, the first electrode layer 111 and the second electrode layer 112 are spread over substantially the entire surface of the wafer placement surface 101 while drawing a predetermined pattern such as a spiral pattern or a meandering pattern. The thicknesses of the first electrode layer 111 and the second electrode layer 112 are each, by way of example, from 30 μm to 120 μm.

The first electrode layer 111 and the second electrode layer 112 are electrically connected through a conductor portion 13. The specific configuration of the conductor portion 13 will be described later.

The upper surface 101 (wafer placement surface 101) of the base 10 is parallel to the lower surface 102. Additionally, the shape of the base 10 is arbitrary. For example, in the embodiment, the shape of the base 10 is circular in plan view, but it is not limited thereto, and may be elliptical, rectangular, trapezoidal or another shape in plan view. For example, the dimension of the base 10 is 20 cm to 35 cm in diameter and 4 mm to 30 mm in thickness.

Shaft

The shaft 20 is tubular in shape with the upper end of the shaft 20 joined to the lower surface center of the base 10. In one aspect, the shaft 20 is joined (bonded) to the lower surface 102 of the base 10 by an adhesive. In another aspect, the shaft 20 may be joined to the base 10 by solid phase joining. The shape of the shaft 20 is arbitrary. In one aspect, the shape of the shaft 20 is cylindrical. In another aspect, the shape of the shaft 20 may be, for example, a square cylinder. The material of shaft 20 is arbitrary. In one aspect, the material of the shaft 20 is an insulating ceramic. In another aspect, the material of the shaft 20 may be, for example, an electrically conductive material (metal).

The shaft 20 having a tubular shape includes an upper surface 21 joined to the lower surface 102 of the base 10, a lower surface 22 located opposite to the upper surface 21, an inner surface 23 connecting the upper surface 21 and the lower surface 22 and constituting the inside of the shaft 20, and an outer surface 24 connecting the upper surface 21 and the lower surface 22 and constituting the outside of the shaft 20.

In the illustrated example, the inner surface 23 is provided parallel to the outer surface 24 along the direction in which the shaft 20 extends. From another viewpoint, the inner surface 23 is provided parallel to a line parallel to the thickness direction of the base 10. However, the inner surface 23 may be inclined such that the inner diameter of the shaft 20 decreases downward, or may be inclined such that the inner diameter of the shaft 20 increases downward. The outer surface 24 may have a similar configuration. Thus, at least one of the inner diameter and the outer diameter can be made different in the shaft 20 from the upper end to the lower end.

Wiring Portion

The wiring portion 4 includes a terminal 41 and a conducting wire 42. The terminal 41 is a metal (bulk material) having a certain length in the vertical direction. In the terminal 41, the upper end side is located inside the base 10 and the lower end side is located outside the base 10. In the illustrated example, the terminal 41 is electrically connected to the first electrode layer 111 and the second electrode layer 112 via the conductor portion 13. This point will be described later.

The shape of the terminal 41 is arbitrary. In one aspect, the terminal 41 is cylindrical in shape. The terminal 41 is, for example, composed of a metal such as Ni, W, Mo and Pt, or an alloy including at least one of the aforementioned metals.

Internal Configuration of Base

Figure 3:
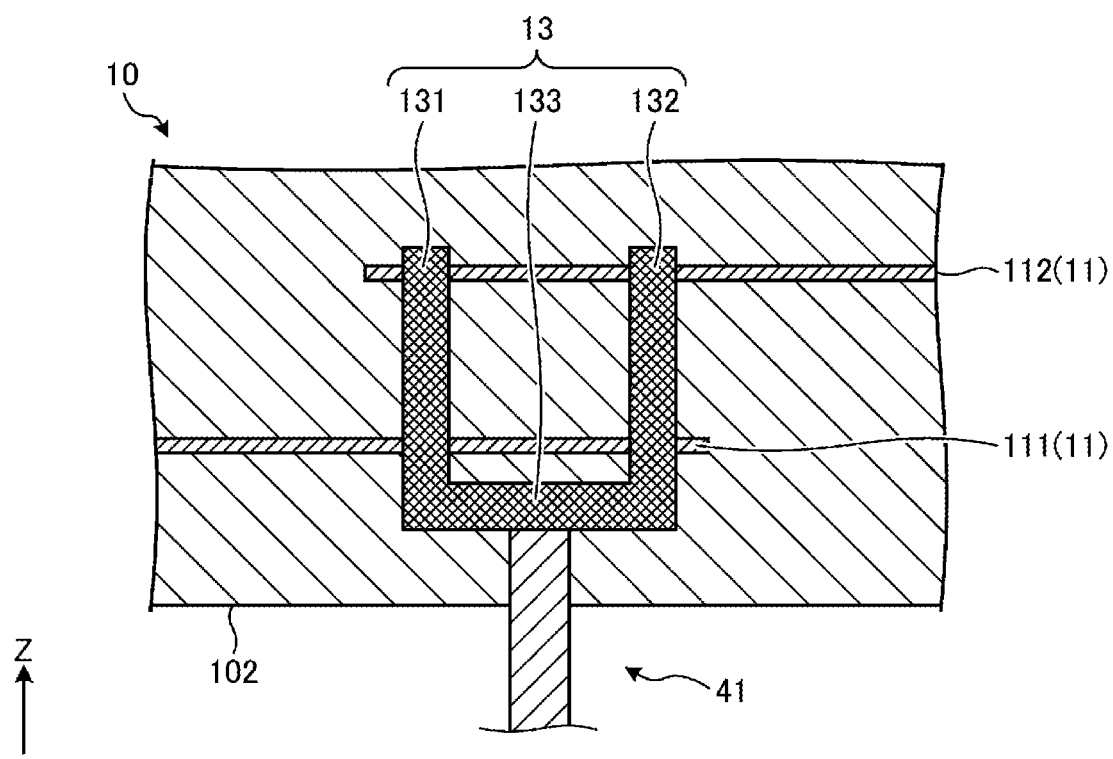
FIG. 3 is a schematic enlarged view of an H portion illustrated in FIG. 2.

Next, the internal configuration of the base 10 described above will be specifically described with reference to FIG. 3. FIG. 3 is a schematic enlarged view of an H portion illustrated in FIG. 2.

As illustrated in FIG. 3, the conductor portion 13 electrically connecting the first electrode layer 111 and the second electrode layer 112 includes a first via conductor 131, a second via conductor 132, and a connection conductor 133. The first via conductor 131, the second via conductor 132, and the connection conductor 133 are composed of, for example, a metal such as Ni, W, Mo, or Pt, or an alloy including at least a portion thereof.

The first via conductor 131 and the second via conductor 132 extend inside the base 10 in a direction intersecting the first electrode layer 111 and the second electrode layer 112. The first via conductor 131 and the second via conductor 132 each penetrate the first electrode layer 111 and the second electrode layer 112.

Although, here, the first via conductor 131 and the second via conductor 132 are illustrated as extending in a direction orthogonal to the first electrode layer 111 and the second electrode layer 112, that is, along the Z axis direction which is the thickness direction of the base 10, the first via conductor 131 and the second via conductor 132 may extend diagonally in the thickness direction of the base 10, for example. Although the first via conductor 131 and the second via conductor 132 are illustrated as extending in parallel, the first via conductor 131 and the second via conductor 132 need not necessarily be parallel. Also, here, although an example is illustrated in which the first via conductor 131 and the second via conductor 132 penetrate the first electrode layer 111 and the second electrode layer 112 respectively, the first via conductor 131 and the second via conductor 132 each need only penetrate at least one of the first electrode layer 111 and the second electrode layer 112.

The connection conductor 133 extends inside the base 10 along the first electrode layer 111 and the second electrode layer 112. In the embodiment, the connection conductor 133 is located between the first electrode layer 111 and the lower surface 102 of the base 10, and connects the respective end portions of the first via conductor 131 and the second via conductor 132, the end portions penetrating the first electrode layer 111.

The structural body composed of a ceramic has room for further improvement in terms of thermal uniformity.

Since the conductor portion 13 is located at a place where the first electrode layer 111 and the second electrode layer 112 overlap in plan view, the place tends to become a heat spot having a higher temperature than other places on the base 10. On the other hand, the conductor portion 13 is mainly composed of a metal and has a higher thermal conductivity than the base 10 composed of a ceramic. In addition, the conductor portion 13 of the embodiment includes the connection conductor 133 extending along the first electrode layer 111 and the second electrode layer 112. Thus, according to the structural body 2 according to the embodiment, the heat generated in the heat spot can be distributed through the connection conductor 133 in the direction along the first electrode layer 111 and the second electrode layer 112, in other words, in the in-plane direction of the wafer placement surface 101. Thus, the structural body 2 according to the embodiment can improve the thermal uniformity.

Further, since the structural body 2 according to the embodiment connects the first electrode layer 111 and the second electrode layer 112 using a plurality of via conductors (the first via conductor 131 and the second via conductor 132), conduction between the first electrode layer 111 and the second electrode layer 112 can be ensured.

Also, when using the structural body 2, the first electrode layer 111 and the second electrode layer 112 expand or contract in the horizontal direction (direction along the wafer placement surface 101) due to temperature changes. Such deformation of the first electrode layer 111 and the second electrode layer 112 may cause cracks in the base 10. On the other hand, in accordance with the structural body 2 according to the embodiment, since the first electrode layer 111 and the second electrode layer 112 are connected by the first via conductor 131 and the second via conductor 132, the thermal deformation of the first electrode layer 111 and the second electrode layer 112 can be suitably suppressed by the first via conductor 131 and the second via conductor 132. Thus, the occurrence of cracks in the base 10 can be suppressed.

In the structural body 2 according to the embodiment, the connection conductor 133 is located on the lower surface 102 side of the base 10 relative to electrode layers 11 (the first electrode layer 111 and the second electrode layer 112).

Thus, heat generated in the first electrode layer 111 and the second electrode layer 112 can be efficiently released to the lower surface 102 side of the base 10. Therefore, according to the structural body 2 according to the embodiment, the thermal uniformity can be further improved.

Also, in the structural body 2 according to the embodiment, the terminal 41 is connected to the connection conductor 133. The thickness (vertical width) of the connection conductor 133 is greater than the respective thicknesses of the first electrode layer 111 and the second electrode layer 112. Therefore, for example, when a hole for inserting the terminal 41 is formed in the base 10, it is less likely to penetrate the first electrode layer 111 or the second electrode layer 112, compared with the case where the terminal 41 is connected to the first electrode layer 111 or the second electrode layer 112, so that it is easier to connect the terminal 41.

The thickness (width in the horizontal direction) of each of the first via conductor 131 and the second via conductor 132 is substantially the same as the thickness of the connection conductor 133. That is, as illustrated in FIG. 3, when the base 10 is viewed in cross section, the respective thicknesses of the first via conductor 131 and the second via conductor 132 are greater than each of the thicknesses of the first electrode layer 111 and the second electrode layer 112. Thus, by thickening the first via conductor 131 and the second via conductor 132, the reliability of the connection between the first electrode layer 111 and the second electrode layer 112, and the first via conductor 131 and the second via conductor 132, can be improved. For example, the respective thicknesses of the first electrode layer 111 and the second electrode layer 112 are from 30 μm to 120 μm, and the respective thicknesses of the first via conductor 131 and the second via conductor 132 are from 0.4 mm to 1 mm.

Method of Manufacturing Base According to Embodiment

In the following, a method of manufacturing the base 10, in the case where the main component of the base 10 is AlN, the main component of the electrode layer 11 is W (tungsten), the main component of the conductor portion 13 is W (tungsten), and the terminal 41 is composed of metal W, will be described.

First, an unfired AlN sheet is prepared. The AlN sheet includes AlN powder as a main component, and includes sintering aid powder such as CaO and $Y_2O_3$, and a binder. The binder is, for example, an acrylic resin, or the like.

An electrode layer sheet, a sheet for the first via conductor, a sheet for the second via conductor, and a sheet for the connection conductor, which are all unfired, are prepared. These sheets are composed of W (tungsten) powder and a binder.

The AlN sheet to be located on the lower surface 102 is cut into the outer edge shape of the base 10 and placed. On this AlN sheet, the prepared AlN sheet, the electrode layer sheet, the sheet for the first via conductor, the sheet for the second via conductor, and the sheet for the connection conductor are further used and the sheets are cut in a predetermined shape and layered in a manner to have the shape of the structural body illustrated in FIG. 3 (the shape before firing). The sheets are layered on each other, and then are brought into close contact with each other by pressurizing the whole to produce a green laminate in which the respective sheets are integrated.

The obtained green laminate is fired at 1700° C. to 1850° C. in a nitrogen gas atmosphere. The base AlN is sintered by firing, and the first via conductor 131 is joined to the first electrode layer 111 and the second electrode layer 112, the second via conductor 132 is joined to the first electrode layer 111 and the second electrode layer 112, and the connection conductor 133 is joined to the first via conductor 131 and the second via conductor 132.

A through hole for attaching the terminal 41 is made on the lower surface 102 side. The terminal 41 is inserted into the through hole, and the connection conductor 133 and the terminal 41 are joined by known brazing, diffusion bonding, or the like. The conducting wire 42 is joined to the terminal 41. The shaft 20 having a tubular shape is joined to the bottom surface 102 of the base 10, and the terminal 41 and the conducting wire 42 are housed inside the shaft 20.

First Modification Example

Figure 4:
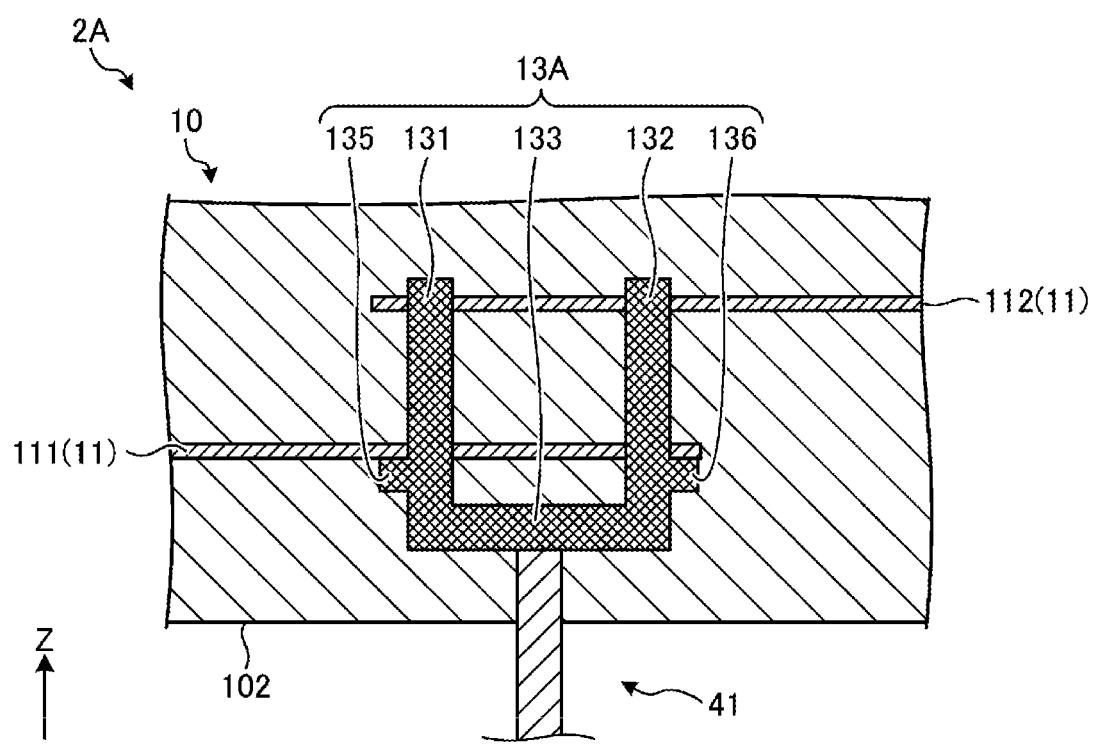
FIG. 4 is a schematic cross-sectional view of a structural body according to a first modification example.

Next, a modification example of the structural body 2 according to the above-described embodiment will be described. First, a structural body according to a first modification example will be described with reference to FIG. 4. FIG. 4 is a schematic cross-sectional view of the structural body according to the first modification example.

As illustrated in FIG. 4, a structural body 2A according to the first modification example includes a conductor portion 13A. The conductor portion 13A according to the first modification example includes protruding portions 135 and 136.

The protruding portion 135 protrudes from the first via conductor 131 in a direction along the first electrode layer 111 and is in contact with the first electrode layer 111. Further, the protruding portion 136 protrudes from the second via conductor 132 in a direction along the first electrode layer 111 and is in contact with the first electrode layer 111.

Thus, by providing the protruding portions 135 and 136 in the conductor portion 13A, the contact surface area between the conductor portion 13A and the first electrode layer 111 can be increased. Therefore, in accordance with the structural body 2A according to the first modification example, the electrical connection between the conductor portion 13A and the first electrode layer 111 can be made more reliable. Further, the joining strength between the conductor portion 13A and the first electrode layer 111 can be enhanced.

Here, an example of a case where both the first via conductor 131 and the second via conductor 132 are provided with the protruding portions 135 and 136 respectively, is illustrated, but the protruding portion 135 or 136 may be provided in at least one of the first via conductor 131 and the second via conductor 132.

In addition, although an example is described in which the protruding portions 135 and 136 protrude outward from the first via conductor 131 and the second via conductor 132 respectively, the protruding portions 135 and 136 may protrude inward from the first via conductor 131 and the second via conductor 132 respectively. That is, the protruding portion 135 may protrude from the first via conductor 131 toward the second via conductor 132, and the protruding portion 136 may protrude from the second via conductor 132 toward the first via conductor 131.

Here, an example is illustrated in which the protruding portions 135 and 136 are in contact with the first electrode layer 111 on the lower surface (the surface located on the lower surface 102 side of the base 10) side of the first electrode layer 111, but the protruding portions 135 and 136 may be in contact with the first electrode layer 111 on the upper surface (the surface located on the wafer placement surface 101 side of the base 10) side of the first electrode layer 111. In other words, the protruding portions 135 and 136 may be located between the first electrode layer 111 and the second electrode layer 112.

Second Modification Example

Figure 5:
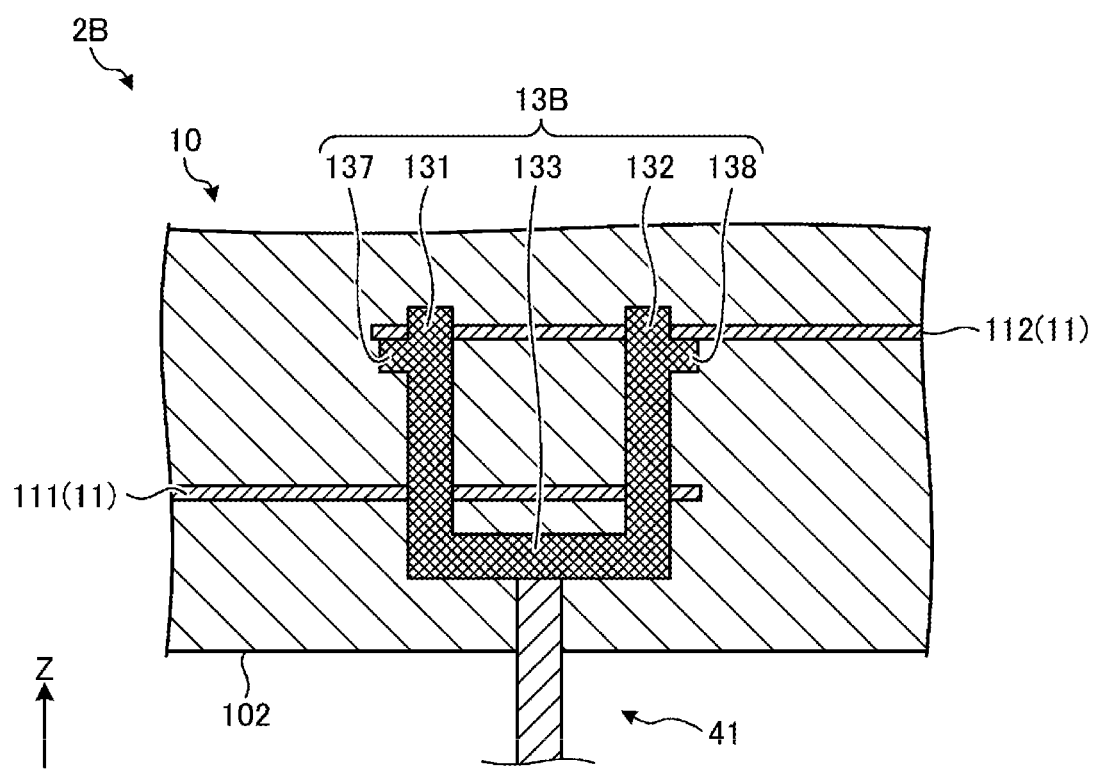
FIG. 5 is a schematic cross-sectional view of a structural body according to a second modification example.

Next, a structural body according to a second modification example will be described with reference to FIG. 5. FIG. 5 is a schematic cross-sectional view of the structural body according to the second modification example.

As illustrated in FIG. 5, the structural body 2B according to the second modification example includes a conductor portion 13B. The conductor portion 13B according to the second modification example includes the protruding portions 137 and 138.

The protruding portion 137 protrudes from the first via conductor 131 in a direction along the second electrode layer 112 and is in contact with the second electrode layer 112. The protruding portion 138 protrudes from the second via conductor 132 in a direction along the second electrode layer 112 and is in contact with the second electrode layer 112.

Thus, the protruding portions 137 and 138 may be in contact with the second electrode layer 112. In this case, since the contact surface area between the conductor portion 13B and the second electrode layer 112 can be increased, the electrical connection between the conductor portion 13B and the second electrode layer 112 can be made more reliable. Further, the joining strength between the conductor portion 13B and the second electrode layer 112 can be enhanced.

Here, an example of a case where both the first via conductor 131 and the second via conductor 132 are provided with the protruding portions 137 and 138 respectively, is illustrated, but the protruding portion 137 or 138 may be provided in at least one of the first via conductor 131 and the second via conductor 132.

In addition, although an example is described in which the protruding portions 137 and 138 protrude outward from the first via conductor 131 and the second via conductor 132 respectively, the protruding portions 137 and 138 may protrude inward from the first via conductor 131 and the second via conductor 132 respectively.

Here, an example is illustrated in which the protruding portions 137 and 138 are in contact with the second electrode layer 112 on the lower surface side of the second electrode layer 112, but the protruding portions 137 and 138 may be in contact with the second electrode layer 112 on the upper surface side of the second electrode layer 112.

In addition, the structural body 2B may further include the protruding portions 135 and 136 according to the first modification example.

Third Modification Example

Figure 6:
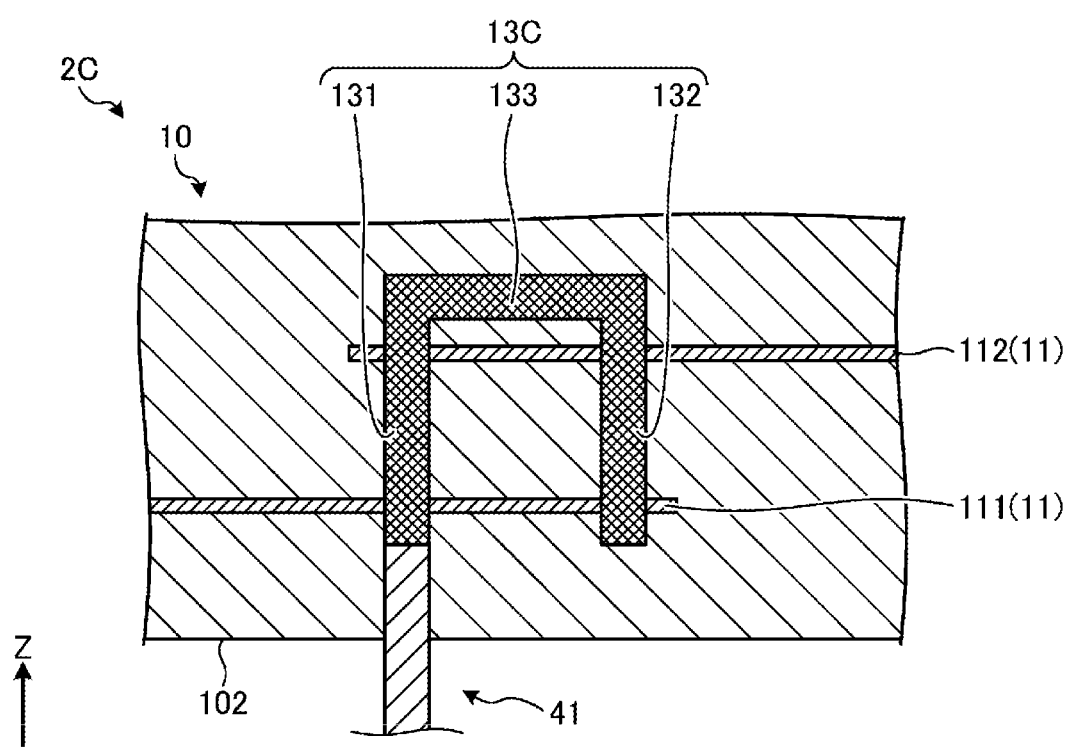
FIG. 6 is a schematic cross-sectional view of a structural body according to a third modification example.

Next, a structural body according to a third modification example will be described with reference to FIG. 6. FIG. 6 is a schematic cross-sectional view of the structural body according to the third modification example.

As illustrated in FIG. 6, a structural body 2C according to the third modification example includes a conductor portion 13C. In the conductor portion 13C according to the third modification example, a connection conductor 133 is located between the second electrode layer 112 and the wafer placement surface 101 of the base 10 (see FIG. 2). The connection conductor 133 according to the third modification example connects respective end portions of the first via conductor 131 and the second via conductor 132, which penetrate the second electrode layer 112.

Thus, the connection conductor 133 may be located on the wafer placement surface 101 side of the base 10 relative to electrode layers 11 (the first electrode layer 111 and the second electrode layer 112).

In the structural body 2C according to the third modification example, the terminal 41 is connected to the first via conductor 131. Specifically, the terminal 41 is connected to an end portion of the first via conductor 131, which penetrates the first electrode layer 111. Thus, the terminal 41 may be connected to the first via conductor 131. The terminal 41 may also be connected to the second via conductor 132.

Fourth Modification Example

Figure 7:
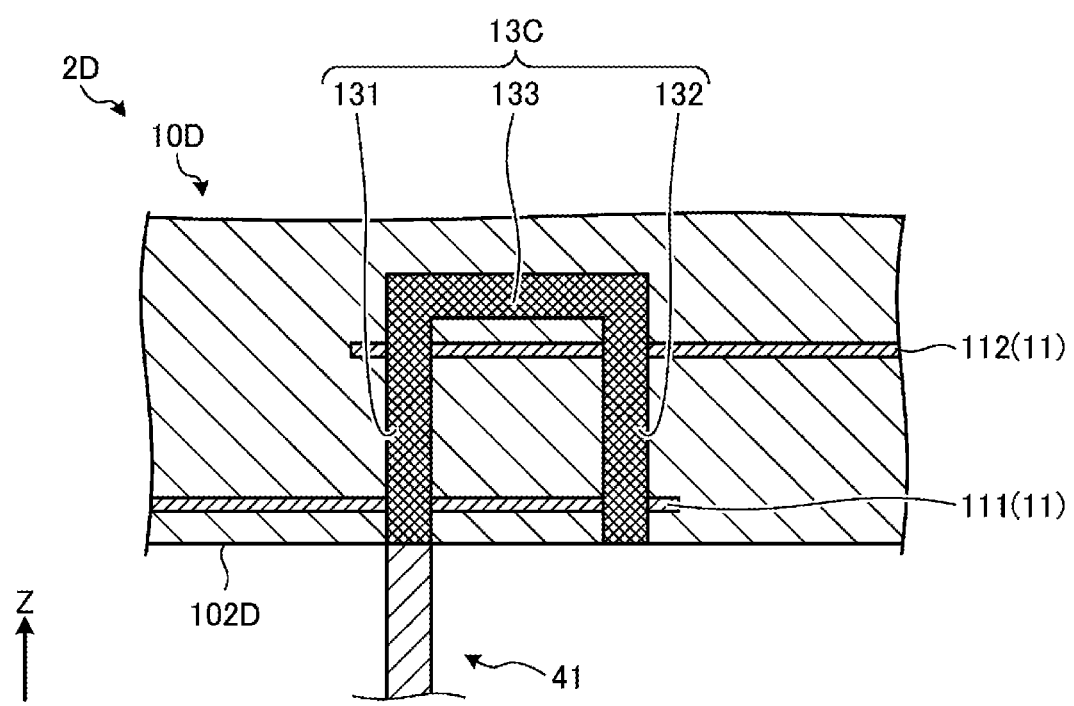
FIG. 7 is a schematic cross-sectional view of a structural body according to a fourth modification example.

Next, a structural body according to a fourth modification example will be described with reference to FIG. 7. FIG. 7 is a schematic cross-sectional view of the structural body according to the fourth modification example.

As illustrated in FIG. 7, the structural body 2D according to the fourth modification example includes a base 10D. The base 10D according to the fourth modification example includes a lower surface 102D at a position where the end portions of the first via conductor 131 and the second via conductor 132, which penetrate the first electrode layer 111, are exposed.

Thus, the exposure of the respective ends of the first via conductor 131 and the second via conductor 132 to the lower surface 102D facilitates connection of the terminal 41 to the end portion of the first via conductor 131 or the second via conductor 132.

Fifth Modification Example

Figure 8:
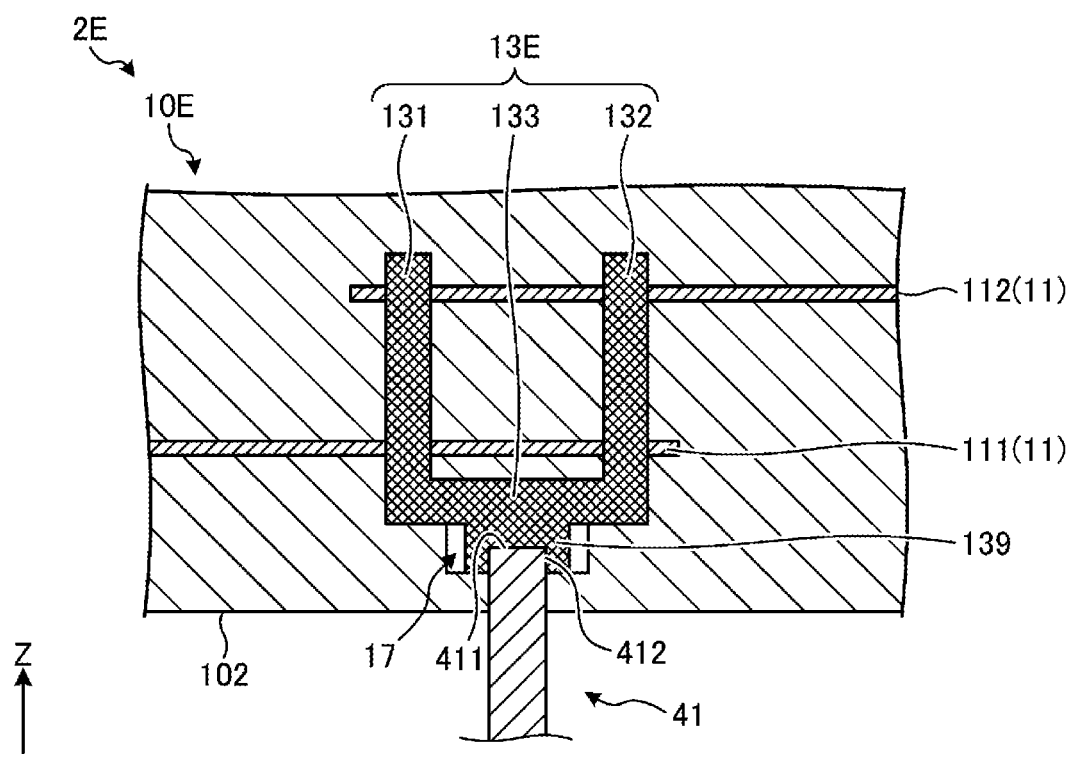
FIG. 8 is a schematic cross-sectional view of a structural body according to a fifth modification example.

Next, a structural body according to a fifth modification example will be described with reference to FIG. 8. FIG. 8 is a schematic cross-sectional view of the structural body according to the fifth modification example.

As illustrated in FIG. 8, in the structural body 2E according to the fifth modification example, the terminal 41 is in contact with the first electrode layer 111 at the tip surface 411 and the side surface 412. Therefore, the joining strength between the terminal 41 and the first electrode layer 111 can be improved as compared with, for example, the case where the terminal 41 contacts the first electrode layer 111 only at the tip surface 411 or the case where the terminal 41 contacts the first electrode layer 111 only at the side surface 412.

The structural body 2E according to the fifth modification example includes a conductor portion 13E. The conductor portion 13E according to the fifth modification example includes a contact portion 139 at a contact location of the connection conductor 133 with the terminal 41. The contact portion 139 is a portion of the connection conductor 133, and the thickness of the contact portion 139 (vertical width) is thicker than other portions of the connection conductor 133. Specifically, the contact portion 139 protrudes toward the lower surface 102 side, that is, toward the side opposite to the wafer placement surface 101, as compared with other portions of the connection conductor 133.

Thus, by making the contact portion 139, which is the contact location with the terminal 41, thicker than the other locations, the contact surface area of the terminal 41 with the side surface 412 can be made larger. Therefore, the joining strength between the terminal 41 and the first electrode layer 111 can be further improved.

The base 10E according to the fifth modification example includes a space 17 around the contact portion 139. The space 17 extends laterally to the contact portion 139 and surrounds the entire circumference of the contact portion 139. Thus, by providing the space 17 around the contact portion 139, heat transfer to the side opposite to the wafer placement surface 101 can be suppressed by the insulating action of the space 17. Therefore, the wafer placed on the wafer placement surface 101 can be efficiently heated.

In the structural body 2E according to the fifth modification example, the first via conductor 131 and the second via conductor 132 are located on both sides of the contact portion 139, respectively. Thus, the location of the first via conductor 131 and the second via conductor 132 on both sides of the contact portion 139 can suppress thermal deformation of the first electrode layer 111 and the second electrode layer 112 around the contact portion 139. Therefore, the joining strength between the terminal 41 and the first electrode layer 111 can be enhanced under the use environment in which the temperature is repeatedly raised and lowered.

Sixth Modification Example

Figure 9:
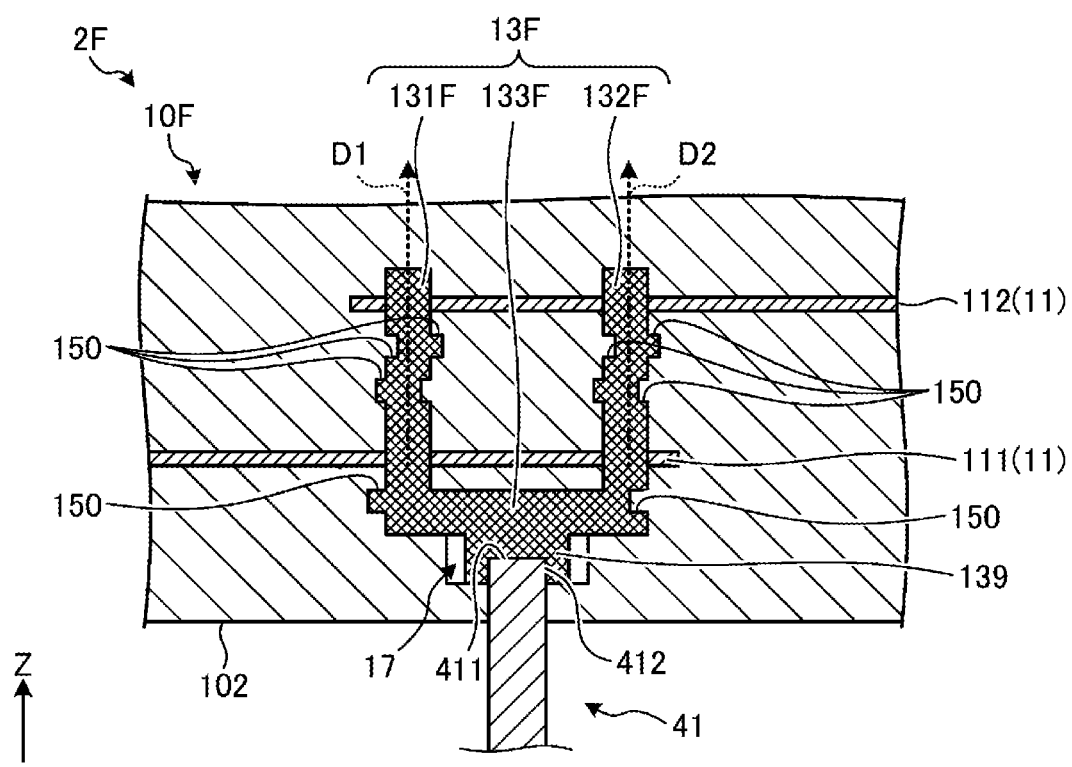
FIG. 9 is a schematic cross-sectional view of a structural body according to a sixth modification example.

Next, a structural body according to a sixth modification example will be described with reference to FIGS. 9 to 13. FIG. 9 is a schematic cross-sectional view of the structural body according to the sixth modification example. FIGS. 10 to 13 are schematic diagrams illustrating aspect examples of the inclinations of the first via conductor 131F and the second via conductor 132F.

As illustrated in FIG. 9, a structural body 2F includes a base 10F and a conductor portion 13F. The base 10F includes the space 17 around the contact portion 139, similar to the base 10E according to the fifth modification example.

The conductor portion 13F includes a first via conductor 131F, a second via conductor 132F, and a connection conductor 133F.

The first via conductor 131F, the second via conductor 132F, and the connection conductor 133F each include a stepped portion 150. The stepped portion 150 includes a plane (stepped surface) along the first electrode layer 111 or the second electrode layer 112. In other words, the first via conductor 131F, the second via conductor 132F, and the connection conductor 133F are deviated in a plurality of locations along the first electrode layer 111 or the second electrode layer 112, and the stepped portion 150 is formed by this deviation.

FIG. 9 illustrates an example in which an extending direction D1 of the first via conductor 131F and an extending direction D2 of the second via conductor 132F both coincide with the vertical direction (Z axis direction). The extending direction D1 of the first via conductor 131F may be specified, for example, by the direction of a straight line (the direction from the lower end toward the upper end) connecting the center portion of the lower end (the end portion on the negative side of the Z axis) and the center portion of the upper end (the end portion on the positive side of the Z axis) of the first via conductor 131F. The same applies to the extending direction D2 of the second via conductor 132F.

The respective extending directions D1 and D2 of the first via conductor 131F and the second via conductor 132F are not limited to the example illustrated in FIG. 9. For example, as illustrated in FIG. 10, the extending directions D1 and D2 may be inclined at predetermined angles $\theta 1$ and $\theta 2$ respectively with respect to the positive Z-axis direction (vertically upward).

Figure 10:
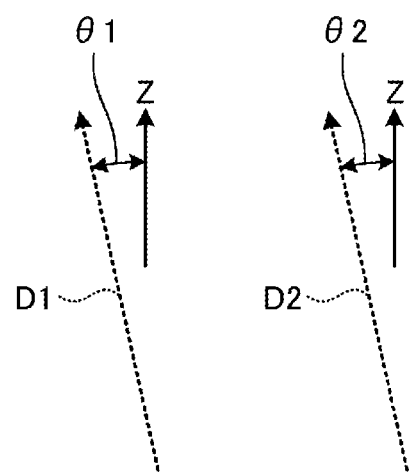
FIG. 10 is a schematic diagram illustrating an aspect example of inclinations of the first via conductor and the second via conductor.
Figure 11:
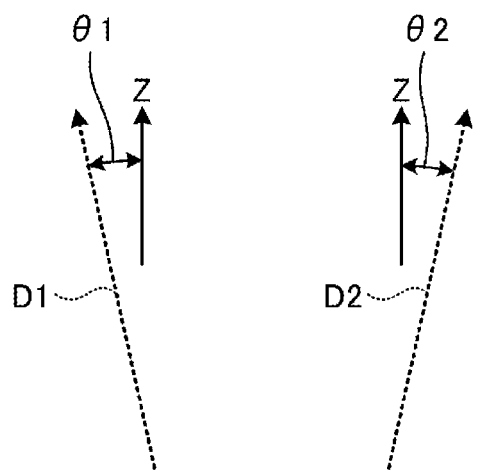
FIG. 11 is a schematic diagram illustrating an aspect example of inclinations of the first via conductor and the second via conductor.
Figure 12:
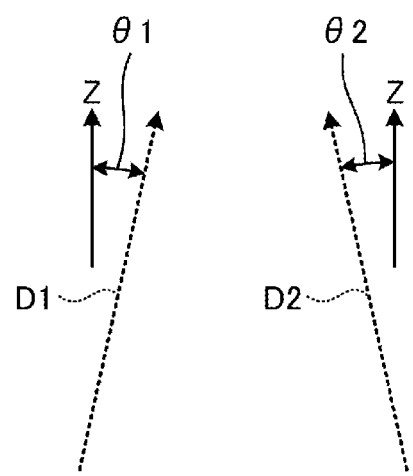
FIG. 12 is a schematic diagram illustrating an aspect example of inclinations of the first via conductor and the second via conductor.

Although FIG. 10 illustrates an example in which the first via conductor 131F and the second via conductor 132F are inclined in the same direction, the inclination directions of the first via conductor 131F and the second via conductor 132F are not necessarily the same. For example, as illustrated in FIG. 11, the first via conductor 131F and the second via conductor 132F may be inclined away from each other from the lower end toward the upper end. As illustrated in FIG. 12, the first via conductor 131F and the second via conductor 132F may be inclined toward each other from the lower end toward the upper end.

Figure 13:
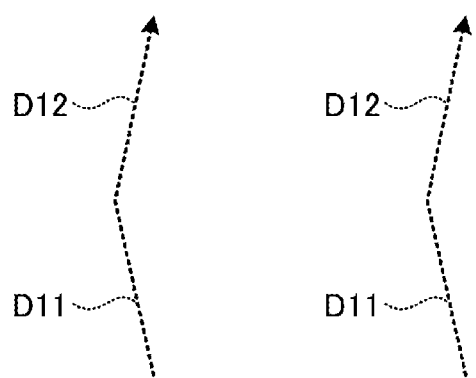
FIG. 13 is a schematic diagram illustrating an aspect example of inclinations of the first via conductor and the second via conductor.

FIGS. 9 to 12 illustrate an example in which the extending directions D1 and D2 of the first via conductor 131F and the second via conductor 132F are constant respectively from the lower end to the upper end, but the respective extending directions D1 and D2 do not necessarily need to be constant. For example, as illustrated in FIG. 13, the extending direction D11 in the lower half of the first via conductor 131F and the extending direction D12 in the upper half of the first via conductor 131F may be different. Similarly, the extending direction D21 in the lower half of the second via conductor 132F and the extending direction D22 in the upper half of the second via conductor 132F may be different.

The inclination angles θ1 and θ2 of the extending directions D1 and D2 are respectively, for example, 2° to 30°.

Figure 14:
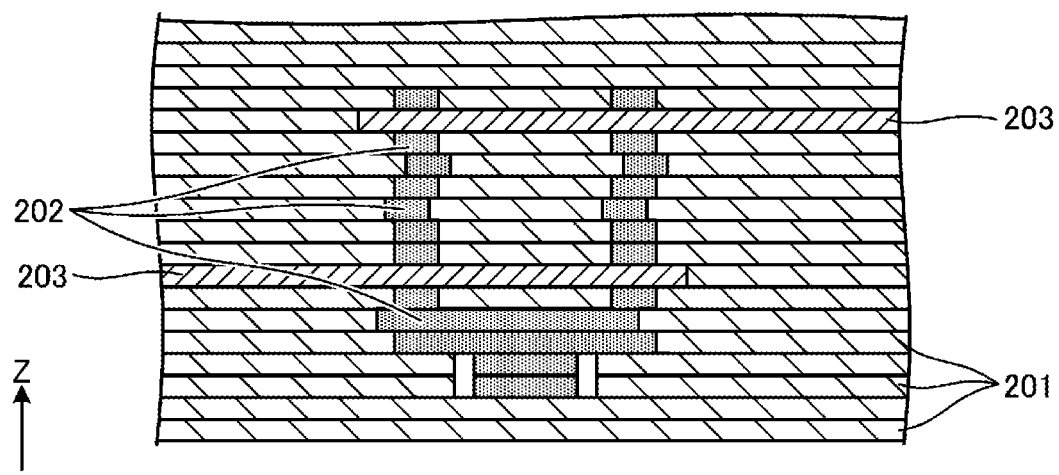
FIG. 14 is a schematic cross-sectional view for illustrating an example of a method of manufacturing the structural body according to the sixth modification example.
Figure 15:
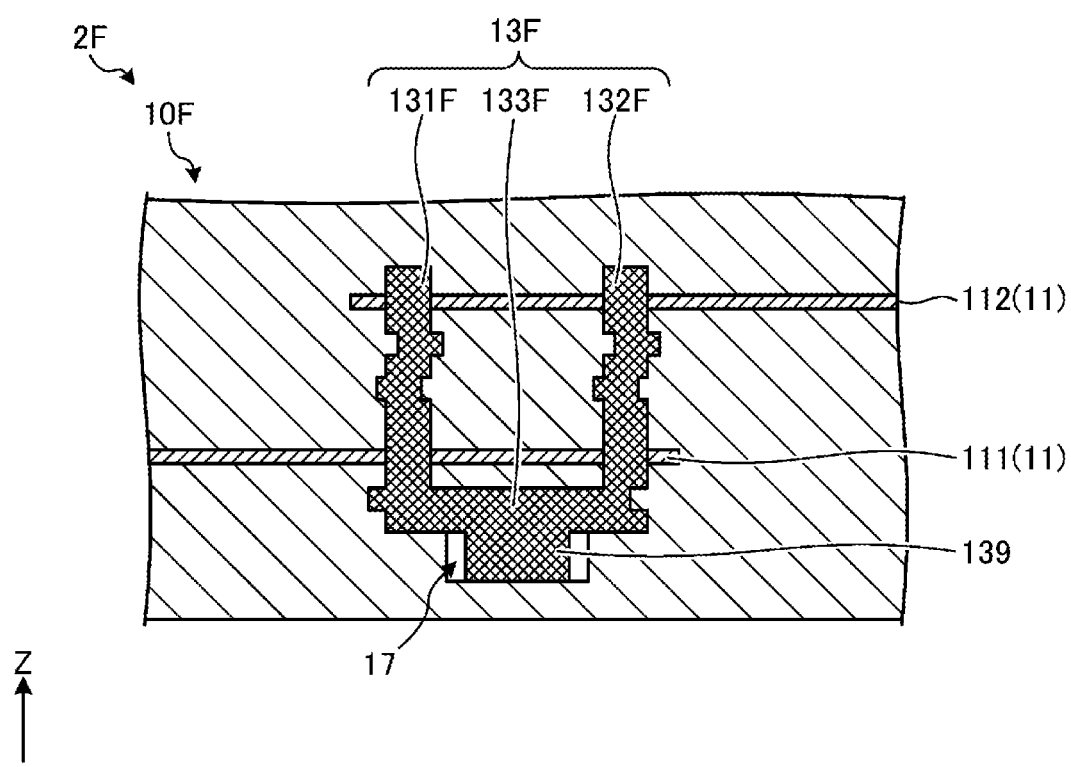
FIG. 15 is a schematic cross-sectional view for illustrating an example of a method of manufacturing the structural body according to the sixth modification example.
Figure 16:
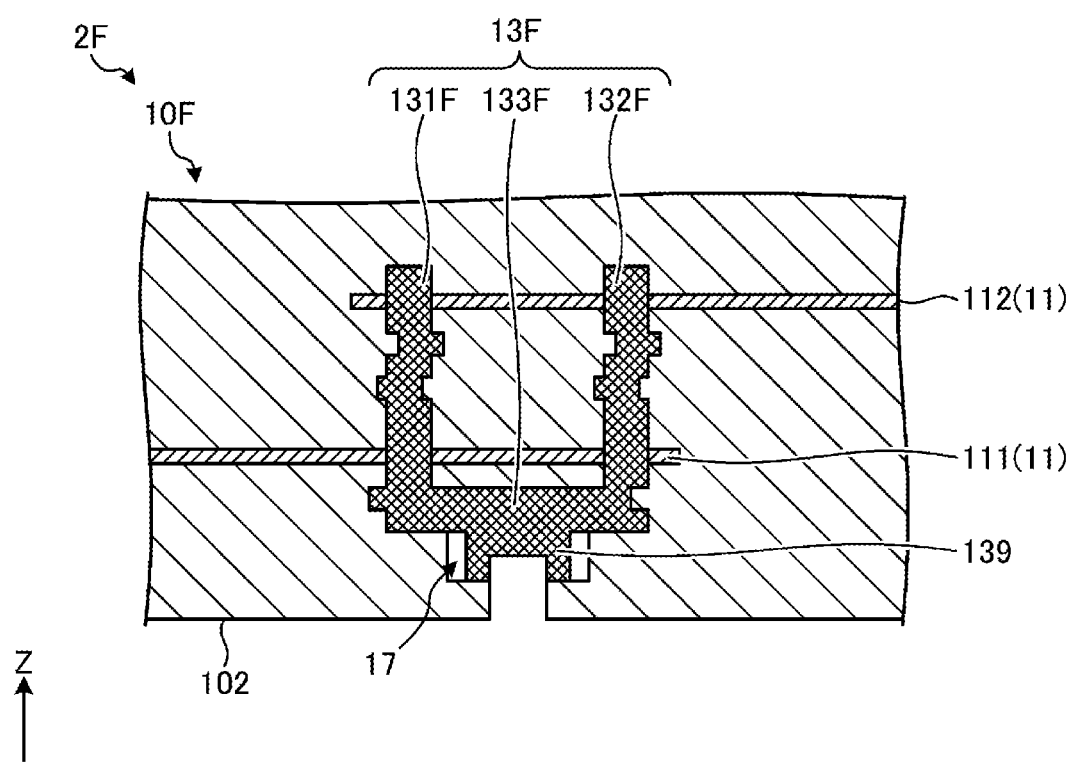
FIG. 16 is a schematic cross-sectional view illustrating an example of a method of manufacturing the structural body according to the sixth modification example.

An example of a method of manufacturing the structural body 2F according to the sixth modification example will be described with reference to FIGS. 14 to 16. FIGS. 14 to 16 are schematic cross-sectional views for explaining an example of the method of manufacturing the structural body 2F according to the sixth modification example.

As illustrated in FIG. 14, a plurality of ceramic green sheets 201 mainly composed of aluminum nitride (AlN) and a plurality of metal sheets 202 and 203 mainly composed of tungsten (W) (a plurality of sheets mainly composed of W metal powder) are layered to form a shape (before firing) of the structural body 2F illustrated in FIG. 9. Openings are formed in predetermined locations in the ceramic green sheets 201, and the metal sheets 202 are positioned in the openings. The sheets are layered on each other, and then are brought into close contact with each other by pressurizing the whole to produce a green laminate in which the respective sheets are integrated.

The obtained green laminate is fired at 1700° C. to 1850° C. in a nitrogen gas atmosphere. As a result, as illustrated in FIG. 15, AlN as a base 10F is sintered. Also, the first via conductor 131F is joined to the first electrode layer 111 and the second electrode layer 112, the second via conductor 132F is joined to the first electrode layer 111 and the second electrode layer 112, and the connection conductor 133F is joined to the first via conductor 131F and the second via conductor 132F.

Then, as illustrated in FIG. 16, a through hole for attaching the terminal 41 is formed on the lower surface 102 side. Thereafter, a Pt (platinum) paste is applied to a bottom portion of the through hole, and the terminal 41 is inserted into the through hole to perform heat treatment. Thus, the terminal 41 and the contact portion 139 are joined. Further, Pt enters the gap between the terminal 41 and the base 10F, and the gap between the terminal 41 and the base 10F is sealed.

Subsequently, after a paste of sealant is applied around the terminal 41, the base 10F is heat treated, for example, at 1550° C. in a vacuum. Thus, the sealant enters the gap between the terminal 41 and the base 10F by capillary action, and the gap between the terminal 41 and the base 10F is further sealed.

Seventh Modification Example

Figure 17:
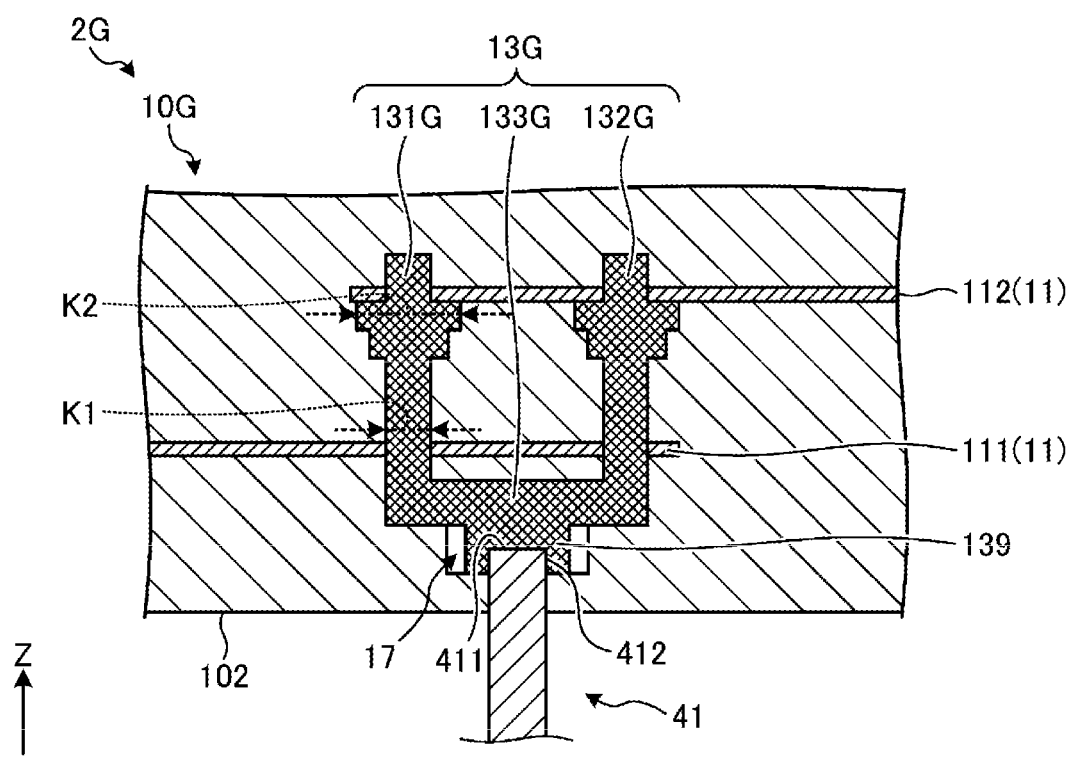
FIG. 17 is a schematic cross-sectional view of a structural body according to a seventh modification example.

Next, a structural body according to a seventh modification example will be described with reference to FIG. 17. FIG. 17 is a schematic cross-sectional view of the structural body according to the seventh modification example.

As illustrated in FIG. 17, a structural body 2G includes a base 10G and a conductor portion 13G. The base 10G includes the space 17 around the contact portion 139, similar to the base 10E according to the fifth modification example.

The conductor portion 13G includes a first via conductor 131G, a second via conductor 132G, and a connection conductor 133G. In each of the first via conductor 131G and the second via conductor 132G, the diameter K2 on the upper end side is larger than the diameter K1 on the lower end side between the first electrode layer 111 and the second electrode layer 112. FIG. 17 illustrates an example in which each of the first via conductor 131G and the second via conductor 132G gradually increases in diameter from the lower end side toward the upper end side between the first electrode layer 111 and the second electrode layer 112.

Eighth Modification Example

Figure 18:
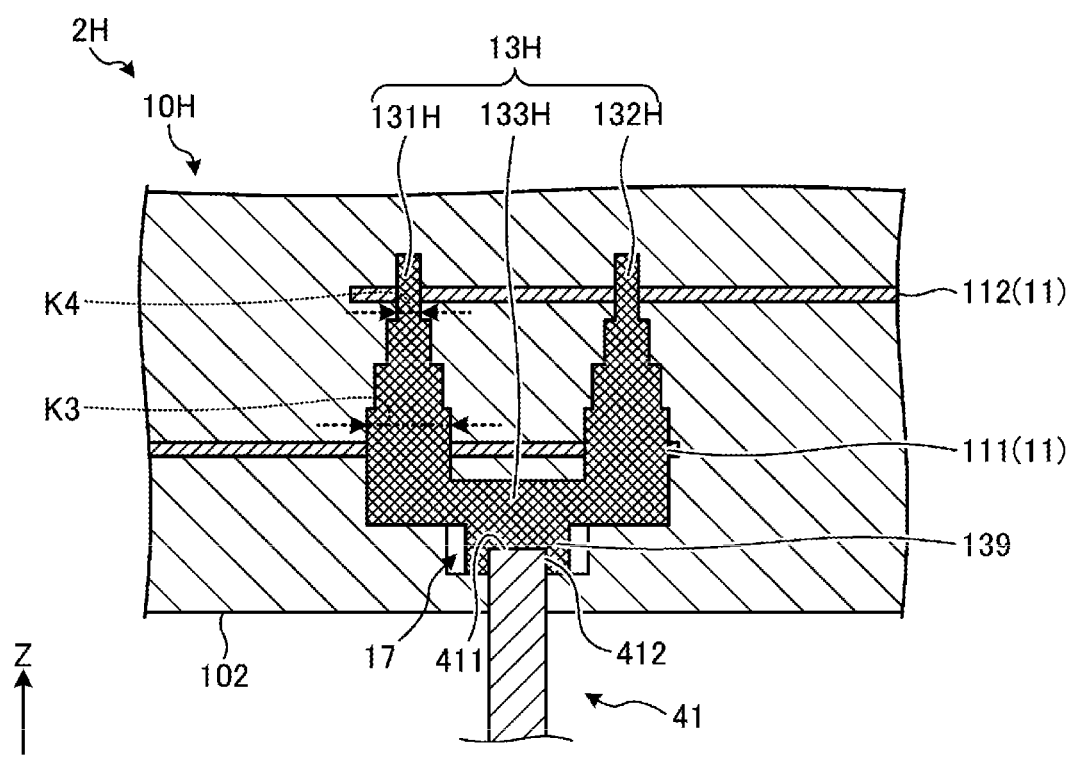
FIG. 18 is a schematic cross-sectional view of a structural body according to the seventh modification example.

Next, a structural body according to an eighth modification example will be described with reference to FIG. 18. FIG. 18 is a schematic cross-sectional view of the structural body according to the seventh modification example.

As illustrated in FIG. 18, a structural body 2H includes a base 10H and a conductor portion 13H. The base 10H includes the space 17 around the contact portion 139, similar to the base 10E according to the fifth modification example.

The conductor portion 13H includes a first via conductor 131H, a second via conductor 132H, and a connection conductor 133H. In each of the first via conductor 131H and the second via conductor 132H, the diameter K4 on the upper end side is smaller than the diameter K3 on the lower end side between the first electrode layer 111 and the second electrode layer 112. FIG. 18 illustrates an example in which each of the first via conductor 131H and the second via conductor 132H gradually decreases in diameter from the lower end side toward the upper end side between the first electrode layer 111 and the second electrode layer 112.

As described above, the structural body (for example, the structural body 2, 2A to 2E) according to the embodiments includes the base (for example, the base 10, 10D, 10E), the first electrode layer (for example, the first electrode layer 111), the second electrode layer (for example, the second electrode layer 112), the first via conductor (for example, the first via conductor 131), the second via conductor (for example, the second via conductor 132), and the connection conductor (for example, the connection conductor 133). The base is composed of a ceramic. The first electrode layer and the second electrode layer are located inside the base. The first via conductor and the second via conductor are located inside the base and connect the first electrode layer and the second electrode layer. The connection conductor is located inside the base and connects the first via conductor and the second via conductor.

Therefore, in accordance with the structural body according to the embodiments, since the heat generated in the heat spot where the first electrode layer and the second electrode layer overlap can be dispersed through the connection portion, the thermal uniformity can be improved.

The first via conductor and the second via conductor penetrate the first electrode layer, and the connection conductor connects the respective end portions of the first via conductor and the second via conductor, which penetrate the first electrode layer. The base includes a first surface (for example, the wafer placement surface 101) on which an object to be placed (for example, a wafer) is placed and a second surface (for example, the lower surface 102) located opposite to the first surface. In this case, the first electrode layer may be located on the second surface side relative to the second electrode layer.

Thus, heat generated in the heat spot can be efficiently released to the second surface side of the base. Therefore, in accordance with the structural body according to the embodiments, the thermal uniformity can be further improved.

The structural body according to the embodiments may include a terminal (for example, the terminal 41) connected to the connection conductor. In this case, the connection conductor may be thicker than each of the first electrode layer and the second electrode layer. Therefore, in accordance with the structural body according to the embodiments, it is easy to connect the terminal.

The terminal may contact the connection conductor at a tip surface (for example, the tip surface 411) and a side surface (for example, the side surface 412) of the terminal. Thus, the joining strength between the terminal and the first electrode layer can be improved as compared with, for example, the case where the terminal contacts the first electrode layer only at the tip surface or the case where the terminal contacts the first electrode layer only at the side surface.

The structural body according to the embodiments may include a protruding portion (for example, the protruding portions 135 to 138) protruding from at least one of the first via conductor and the second via conductor in a direction along and in contact with the first electrode layer or the second electrode layer Thus, since the contact surface area between the conductor portion and the first electrode layer can be increased, the electrical connection between the conductor portion and the first electrode layer can be made more reliable.

Although the above-described embodiments have been described with reference to a wafer placement apparatus as an example of a heating apparatus, the heating apparatus according to the present disclosure may be one that heats an object (e.g., an object to be placed that is placed on one side of the base) by heating the electrode layer inside the base, and is not limited to the wafer placement apparatus.

Further effects and modification examples can be readily derived by those skilled in the art. Thus, the broader aspects of the present invention are not limited to the specific details and representative embodiments represented and described above. Accordingly, various changes may be made without departing from the spirit or scope of the general inventive concept as defined by the appended claims and their equivalents.

REFERENCE SIGNS LIST

1 Wafer placement apparatus
2 Structural body
4 Wiring portion
5 Power supply unit
6 Controller
10 Base
11 Electrode layer
13 Conductor portion
20 Shaft
41 Terminal
101 Upper surface (Wafer placement surface)
102 Lower surface
111 First electrode layer
112 Second electrode layer
131 First via conductor
132 Second via conductor
133 Connection conductor
135 to 139 Protruding portion

The invention claimed is:

1. A heating apparatus comprising:
a base composed of a ceramic;
a first electrode layer forming a first heater located inside the base;
a second electrode layer forming the first heater located inside the base;
a first via conductor located inside the base and connecting the first electrode layer and the second electrode layer;
a second via conductor located inside the base and connecting the first electrode layer and the second electrode layer;
a connection conductor located inside the base and connecting the first via conductor and the second via conductor, and
a terminal connected to the connection conductor,
wherein the connection conductor is thicker than each of the first electrode layer and the second electrode layer.

2. The heating apparatus according to claim 1, wherein
the first via conductor and the second via conductor penetrate the first electrode layer, and
the connection conductor connects respective end portions of the first via conductor and the second via conductor, the end portions penetrating the first electrode layer.

3. The heating apparatus according to claim 2, wherein
the base comprises a first surface on which an object to be placed is placed and a second surface located opposite to the first surface, and
the first electrode layer is located on the second surface side relative to the second electrode layer.

4. The heating apparatus according to claim 1, wherein the terminal contacts the connection conductor at a tip and a side surface of the terminal.

5. The heating apparatus according to claim 1, further comprising:
a protruding portion protruding from at least one of the first via conductor and the second via conductor in a direction along and in contact with the first electrode layer or the second electrode layer.

6. The heating apparatus according to claim 1, wherein each of the first via conductor and the second via conductor includes a stepped portion provided in a manner to form a stepped surface along the first electrode layer or the second electrode layer.

7. The heating apparatus according to claim 1, wherein each of the first via conductor and the second via conductor gradually increases or decreases in diameter between the first electrode layer and the second electrode layer.

8. The heating apparatus according to claim 1, wherein the structural body is used in a heating apparatus configured to heat an object by heating the first electrode layer and the second electrode layer.

9. The heating apparatus of claim 1, further comprising:
a power supply unit configured to heat the first electrode layer and the second electrode layer by supplying electric power to the first electrode layer and the second electrode layer.

* * * * *